United States Patent [19]

Einbinder

[11] Patent Number: 4,905,358

[45] Date of Patent: Mar. 6, 1990

[54] THIN FILM ACTIVE TRIMMABLE CAPACITOR/INDUCTOR

[75] Inventor: Stephen B. Einbinder, Plantation, Fla.

[73] Assignee: Motorola, Inc., Schaumburg, Ill.

[21] Appl. No.: 298,544

[22] Filed: Jan. 18, 1989

[51] Int. Cl.⁴ .............................................. H01G 4/40
[52] U.S. Cl. .................................. 29/25.42; 29/602.1;
29/84 D; 29/841; 219/121.69; 336/200
[58] Field of Search .................. 29/25.42, 602.1, 841,
29/840; 219/121 LG, 121 LH, 121 LJ; 336/200

[56] References Cited

U.S. PATENT DOCUMENTS

| | | | |
|---|---|---|---|
| 3,512,254 | 5/1970 | Jenkins et al. ...................... | 29/620 X |
| 3,913,219 | 10/1975 | Lichtblau ......................... | 29/25.42 X |
| 3,947,934 | 4/1976 | Olson .................... | 29/25.42 |
| 4,035,695 | 7/1977 | Knutson et al. .................... | 361/400 |
| 4,176,445 | 12/1979 | Solow ............... | 29/620 X |
| 4,369,557 | 1/1983 | Vandebult ......................... | 29/25.42 |
| 4,494,100 | 1/1985 | Stengel et al. ..................... | 336/200 |

Primary Examiner—Carl E. Hall
Attorney, Agent, or Firm—Daniel K. Nichols; Juliana Agon

[57] ABSTRACT

A shorted component 10 is provided on a module 18 whereby the shorted component 10 is trimmed to either a capacitor 22 or an inductor 30. In the same step, the capacitor or inductor is further trimmed to a predetermined value of reactance.

13 Claims, 1 Drawing Sheet

THIN FILM ACTIVE TRIMMABLE CAPACITOR/INDUCTOR

TECHNICAL FIELD

This invention relates generally to trimmable components, and more specifically to trimmable capacitors and inductors, and is more particularly directed toward trimmable capacitors and inductors used in voltage controlled oscillators (VCO).

BACKGROUND ART

The current trend in portable radio design is toward product miniaturization. For the radio to be small, it shoud ideally be made up of small parts or modules. One such module is the VCO module, which typically contains small thin film cpacitors and inductors.

The construction of conventional thin film capacitors and inductors is known. Typically, a metal pattern is deposited on a substrate, which is laser trimmed to form multiple capacitors or inductors. This substrate is cut to form the individual capacitors or inductors. The individual capacitor or inductor is placed on a module, such as a VCO, to enable an active trimming operation by a laser to optimize the VCO operation.

Since the substrate is cut to provide the individual components, the registration marks used to guide the laser trim operation are lost. Component placement on the VCO module is accomplished via the registration marks on the VCO module. Since the placement of the parts is non-ideal, the components may be skewed relative to these registration marks. Thus, the laser trimming procedure to optimize VCO performance requires a further realignment with registrations points taken from the individual capacitor or inductor. Since finding these sufficient registration points is a time-consuming process, a need exists to optimize this process.

SUMMARY OF THE INVENTION

Accordingly, it is an object of the present invention to eliminate the time consuming step of finding sufficient registration points for the active trim process.

Briefly, according to the invention, a shorted component is placed on the module whereby the shorted component is trimmed to either a capacitor or an inductor. In the same step, the capacitor or inductor is further trimmed to a predetermined value or reactance.

DETAILED DESCRIPTION OF THE PREFERRED EMBODIMENT

Figure 1:
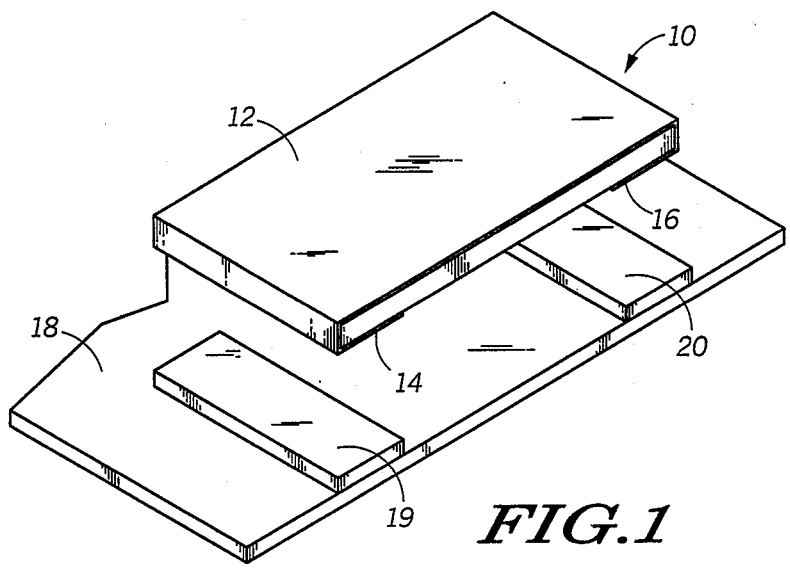
FIG. 1 is an illustration of a shorted component being positioned on top of a module in accordance with the present invention.

Referring to FIG. 1, a shorted component 10 has a top surface 12 and wrap-around pads 14 and 16 on each end. Each of these surfaces 12, 14, and 16 are covered with a suitable metallic covering, which comprises gold in the preferred embodiment. In accordance with the present invention, the shorted component 10 is positioned on a module 18 via bonding pads 19 and 20.

Figure 2:
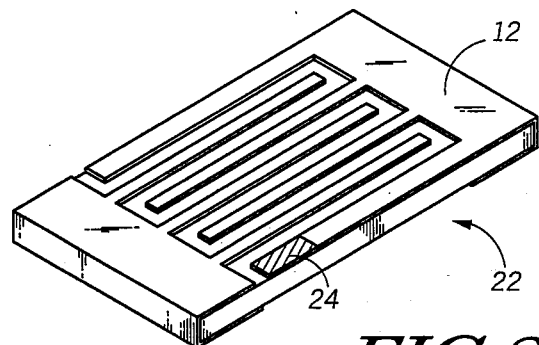
FIG. 2 shows an illustration of a capacitor in accordance with the present invention.

Referring to FIG. 2, a capacitor may be adapted from the shorted component 10 of FIG. 1 after mounting to the module 18. After registration points are taken from the shorted component 10, the top surface 12 may be laser trimmed with an interdigitated pattern as shown in FIG. 2 to yield a capacitor 22. With this process, a small-valued capacitor 22 may be produced within a tunable capacitance of range from 0.2 pico-Farads to 0.95 pico-Farads. Using the same registration points determined to modify the shorted component 10 into the capacitor 22, the capacitor 22 may be further optimized for a particular VCO design by trimming it to a predetermined value of capacitance by removing metal from the indigitated fingers 24 as shown by the hatch marks.

Figure 3:
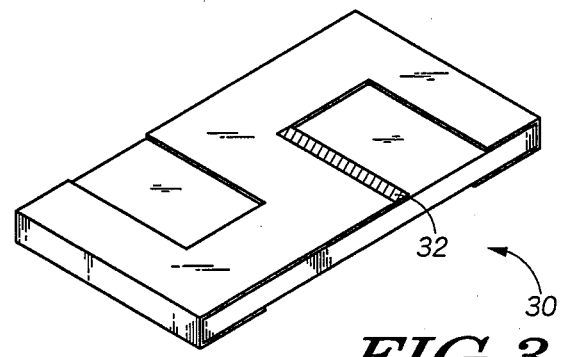
FIG. 3 is an illustration of an inductor in accordance with the present invention.

Referring to FIG. 3, an inductor 30 may be adapted from the shorted component 10 of FIG. 1 after mounting to the module 18. After determining the registration points from the shorted component 10, the top surface 12 may be trimmed to the inductor as shown in FIG. 3, which has a range of 1 to 4 nanoHenries. As with the capacitor 22, the same registration points determined to modify the shorted component 10 into the inductor 30, may be used to further trim the inductor 30 to a predetermined value of inductance by removing metal (32) as shown in FIG. 3.

In this way a VCO module may be made using the shorted component 10 everywhere a capacitor or an inductor is needed. After this, a single laser trimming operation creates the appropriate capacitor or inductor as required, and also optimizes VCO performance.

What is claimed is:

1. A method of fabricating a capacitor or an inductor comprising the steps of:
   (a) positioning a self-supporting short circuit element having at least two contacts as a component of an electronic circuit residing on a substrate;
   (b) modifying said short circuit element within said electronic circuit to eliminate the short circuit and form a capacitor structure, and further modifying said capacitor structure to provide a capacitance value when a capacitor is preferred for proper operation of said electronic circuit; and
   (c) modifying said short circuit element within said electronic circuit to eliminate the short circuit and form an inductor structure and further modifying said inductor structure to provide an inductance value when an inductor is preferred for proper operation of said electronic circuit.

2. The method of claim 1 wherein step b comprises further modifying said capacitor structure to said capacitance value having a range of 0.2 pF to a 0.95 pF.

3. The method of claim 1 wherein said step a comprises soldering said self-supporting short circuit element having at least two contacts as said component of said electronic circuit residing on said substrate.

4. The method of claim 1 wherein said step c comprises further modifying said inductor structure to said inductance value having a range of 1 to 4 nH.

5. The method of claim 1 wherein the modifying steps in steps b and c comprise selective trimming.

6. The method of claim 1 wherein the modifying steps in steps b and c comprise selective laser trimming in one continuous process.

7. The method of claim 1 wherein step a comprises positioning said self-supporting short circuit element having two wrap-around pads on each end as said component of said electronic circuit residing on said substrate.

8. The method of claim 1 wherein step a comprises positioning said self-supporting short circuit element having a top surface covered with gold.

9. A method of fabricating a capacitor or an inductor comprising the steps of:
   (a) positioning a self-supporting short circuit element having at least two contacts as a component of an electronic circuit residing on a substrate;
   (b) laser trimming said short circuit element within said electronic circuit to eliminate the short circuit and form a capacitor structure and further laser trimming said capacitor structure to provide a capacitance value when a capacitor is preferred for proper operation of said electronic circuit; and
   (c) laser trimming said short circuit element within said electronic circuit to eliminate the short circuit and form an inductor structure and further laser trimming said inductor structure to provide an inductance value when an inductor is preferred for proper operation of said electronic circuit.

10. The method of claim 9 wherein step b comprises further laser trimming said capacitor structure to said capacitance value having a range of 0.2 pF to a 0.95 pF.

11. The method of claim 9 wherein said step c comprises further laser trimming said inductor structure to said inductance value having a range of 1 to 4 nH.

12. A method for manufacturing and optimizing a voltage controlled oscillator, comprising the steps of:
   (a) positioning a plurality of self-supporting short circuit elements each having at least two contacts as components of an electronic circuit residing on a module;
   (b) modifying at least one of said short circuit elements within said electronic circuit to eliminate the short circuit and form a capacitor structure and further modifying said capacitor structure to provide a capacitance value when a capacitor is preferred for proper operation of said electronic circuit; and
   (c) modifying said at least one of said short circuit elements within said electronic circuit to eliminate the short circuit and form an inductor structure and further modifying said inductor structure to provide an inductance value when an inductor is preferred for proper opreation of said electronic circuit.

13. A method for manufacturing and optimizing a voltage controlled oscillator, comprising the steps of:
   (a) positioning a plurality of self-supporting short circuit elements each having at least two contacts as components of an electronic circuit residing on a module;
   (b) laser trimming at least one of said short circuit elements within said electronic circuit to eliminate the short circuit and form a capacitor structure, and further laser trimming at least one of said capacitor structure to provide a capacitance value when a capacitor is preferred for proper operation of said electronic circuit; and
   (c) laser trimming at least one of said short circuit elements within said electronic circuit to eliminate the short circuit and form an inductor structure and further laser trimming at least one of said inductor structure to provide an inductance value when an inductor is preferred for proper operation of said electronic circuit.

* * * * *